US008659301B2

(12) United States Patent
Lamb (10) Patent No.: US 8,659,301 B2
(45) Date of Patent: Feb. 25, 2014

(54) APPARATUS FOR PREVENTING DAMAGE TO ELECTRONICS CAUSED BY A BROKEN OR DAMAGED SERVICE NEUTRAL LINE CONNECTION

(75) Inventor: Cody William Lamb, Altamonte Springs, FL (US)

(73) Assignee: Cody Lamb, Atlanta, GA (US)

( * ) Notice: Subject to any disclaimer, the term of this patent is extended or adjusted under 35 U.S.C. 154(b) by 327 days.

(21) Appl. No.: 13/020,666

(22) Filed: Feb. 3, 2011

(65) Prior Publication Data

US 2012/0200300 A1    Aug. 9, 2012

(51) Int. Cl.
*G01R 31/02* (2006.01)
(52) U.S. Cl.
USPC .......................................... 324/537
(58) Field of Classification Search
USPC .............. 361/42, 45–50, 56, 91.3, 118; 363/41–47, 89, 90, 98; 324/537
See application file for complete search history.

(56) References Cited

U.S. PATENT DOCUMENTS

| 4,104,687 | A | * | 8/1978 | Zulaski | 361/17 |
| 5,440,441 | A | * | 8/1995 | Ahuja | 361/62 |
| 5,859,756 | A | * | 1/1999 | Pressman et al. | 361/90 |
| 2005/0259373 | A1 | * | 11/2005 | Hoopes | 361/90 |

* cited by examiner

*Primary Examiner* — Patrick Assouad
*Assistant Examiner* — Brent J Andrews (57) ABSTRACT

This invention is a system that will prevent damage to electronics if the service neutral line is broken or damaged, or if other failures cause the voltage between the active line and neutral line to increase above typical regulated values. Damage to the service neutral line can cause erratic voltages between the active line and ground terminals of a home or business, often damaging electronics without tripping circuit breaker switches. This design is an easily-built, easily-installed and cost effective way to determine if the voltage between the active line and the neutral line is too high and, if so, disable current from reaching electronic equipment.

13 Claims, 5 Drawing Sheets

APPARATUS FOR PREVENTING DAMAGE TO ELECTRONICS CAUSED BY A BROKEN OR DAMAGED SERVICE NEUTRAL LINE CONNECTION

BACKGROUND OF THE INVENTION

Broken or damaged service neutral lines are known to cause possible damage to appliances and electronics plugged into the electrical outlet of a house or business. When a service neutral connection is broken, the voltage between the high voltage line, herein referred to as the active line, and the neutral/ground connection can be erratic. It can be lower or higher than the standard RMS value of 120 volts. This often manifests itself as a dimming and brightening of lights as the voltage lowers and raises arbitrarily. Other effects can also be seen, such as compressors in refrigerators or air conditioning units running at lower or higher speeds than normal. At high voltages, excessive current may flow through electronics that are plugged into wall outlets and destroy them. Damage can occur to smaller electronics such as nightlights, computers and computer accessories or to large appliances such as refrigerators, garage door openers and air conditioners. In some cases, fires can start from burning equipment or improperly grounded equipment can become charged to a high voltage possibly lethal to humans. Often, utility companies will pay for damaged equipment if the break in the line is before it enters the power meter but if the break occurs beyond the meter, the owner typically must pay an electrician to repair the damage and cover the cost of any damaged items. This can be costly and time consuming, both for the utility company and for the customer.

Previous attempts to solve this problem include US Patent Application Publication No. 2010/0102826 by Edwards which involves measuring the input and output current and calculating the ratio to determine if a fault exists. This is an effective method, but is somewhat costly if used for detecting broken service neutral lines and is used only at the meter at the input of a home or business. The neutral line may break inside a house due to accidental damage and may only break on a single circuit to a certain part of the house, so it is desirable to have protection both for the input to the home or business and at other locations on different circuits throughout the home or business where a broken neutral line could cause a current flow between the active line and earth ground. Also, electronic equipment used away from a home or business, such as at a hotel or conference center, needs to have its own protection, even if the building that the owner of the equipment is in does not have its own protection. This protection could be either a module that the device plugs into or integrated into the device itself.

Overvoltage protection and detection exists, but typically requires an active power supply rail to power the active components processing the input voltages to determine an overvoltage. In the case of a broken service neutral line, power supply rails themselves can be damaged or destroyed, preventing existing overvoltage detection/protection and leading to damage of electronics. A device is needed which can be plugged into an electrical outlet with an unknown voltage between the active line and neutral/earth ground line in the event that the service neutral line is broken or damaged. A device that protects against this failure must be able to determine whether the input voltage is accurate by using internal electronics that are resilient to possible changes in the input voltage and capable of outputting a signal to warn of the condition and/or cut off the current at the active line. This way, if the voltage between the active line and neutral/earth ground connection becomes too high, the device itself can function at this high voltage and still perform the process necessary to warn of the condition or prevent damage to other devices, since a regulated input voltage is not guaranteed if the service neutral line is broken or if something else such as a malfunctioning transformer affects the voltage between the active line and neutral/earth connection. The device described in this application is low-cost, prevents damage caused by overvoltage conditions in the event of a broken service neutral line, is resilient to overvoltage itself, and is installable at several points in the power grid, from the input to a house or business to the input circuitry of electronic appliances. Consequently, this device can also protect against generic overvoltage conditions as well as provide protection against broken service neutral lines.

SUMMARY OF THE INVENTION

This invention is a device that can be connected between the high voltage and the neutral connection of an office, plant or home and can determine if the voltage is excessively high due to a broken or damaged neutral line or another failure in the power grid. While surge protectors are common for protecting against short duration, high voltage transient spikes, they do not protect against conditions where the voltage is held at an excessively high potential with respect to ground. This typically happens if there is damage in the service neutral line, so that the voltage between the high voltage line and ground is erratic rather than a constant 120 RMS sine wave voltage. With this fluctuation, the voltage can be excessively high in magnitude, either negative or positive, across the active line to neutral connection. If appliances are plugged in or turned on, they can experience a higher voltage across their loads than they are designed for, causing them to be destroyed without drawing enough current to trip the breaker. At a minimum, the appliances can have their power supplies damaged or fuses blown which also require time and money to repair.

The ideal embodiment of this invention is an apparatus connected between the active line and the neutral connection that rectifies the input voltage and then biases a Zener diode to produce a constant DC voltage for regulation. The rectified voltage is also run in parallel through a voltage divider with a ratio of resistors such that the output voltage is equal or greater to the DC voltage only if the input voltage is higher than a maximum safe value. The output of the voltage regulator and the DC input are input into a comparator, so that if the voltage across the voltage divider becomes too high, the output of the comparator will switch to the high voltage rail. This will send a signal that can warn of an overvoltage condition across a circuit or can feed into a circuit breaker to block the excessive current from entering a house, office, or local appliances. This can be useful either for the input power lines to a house, in case the service neutral line to the house breaks, or for individual outlets or rooms in case the neutral wiring breaks internally in a building on a particular circuit. This could be useful for individuals or businesses who wish to protect their equipment from damage caused by broken neutral connections or for electricity providers who wish to protect their clients from damage at the line input to the box to avoid liability in case of a break in the neutral line before the customer's meter.

DETAILED DESCRIPTION OF THE DRAWINGS

Figure 1:
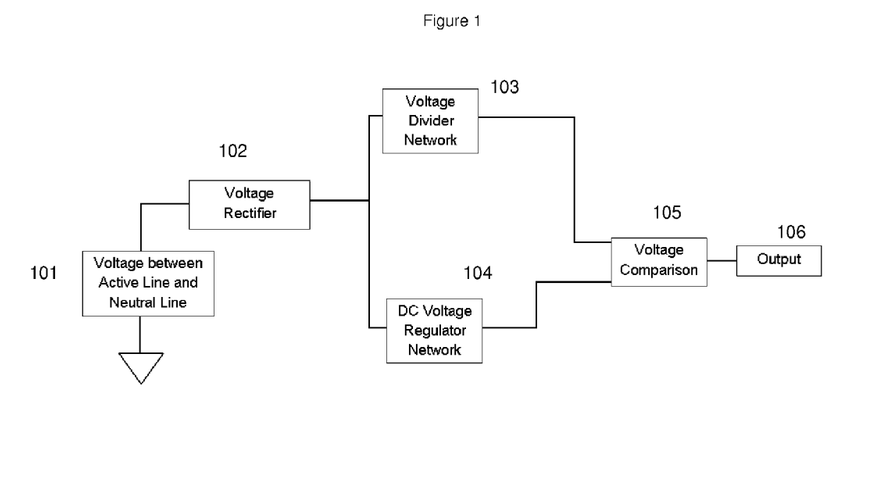
FIG. 1 is a block diagram showing the overvoltage detection portion of the system.

FIG. 1 is a block diagram depicting the general operation of the invention. While the voltage between the active line and neutral line is typically, in the United States, an AC voltage with a frequency of 60 Hz and an amplitude of 120 VRMS under normal conditions, this is not guaranteed at all times, particularly if the service neutral line is broken. If the service neutral line to the building is damaged, then this voltage difference between the active line and the neutral line can be an arbitrarily large voltage either negative or positive with respect to the earth ground, or it can be an AC voltage with a different amplitude if the break is at a transformer. In FIG. 1, the input voltage 101 is rectified by a rectifier 102 such that the output is a positive value roughly equivalent to the magnitude of the peak value of the voltage. Under normal operating conditions in the United States, this would be approximately $120\sqrt{2}$ volts because of the 120 VRMS voltage, but with a break in the neutral line, it can change to any arbitrary value. From here, the output voltage of the rectifier is input into two paths; one path from the output is fed into a DC voltage regulator network 104, which creates a constant DC output that may be obtained via a Zener diode or an outside DC voltage source. The other path is fed into a pure voltage divider network 103 which has an output of a pre-determined value for a normal input voltage from the rectifier. This value is compared to the DC output via such means as a voltmeter or a comparator 105. If the value from the voltage divider network is greater than the DC output, then this means that the rectified value is too large and there is a possible service neutral line failure causing a high voltage. An output 106 from the comparator or voltmeter indicating an excessively high voltage can then be fed to a separate circuit designed to isolate any circuit attached to the active line. This could be implemented either at the input from the line or on individual outlets or even in internal hardware to an appliance.

Figure 2:
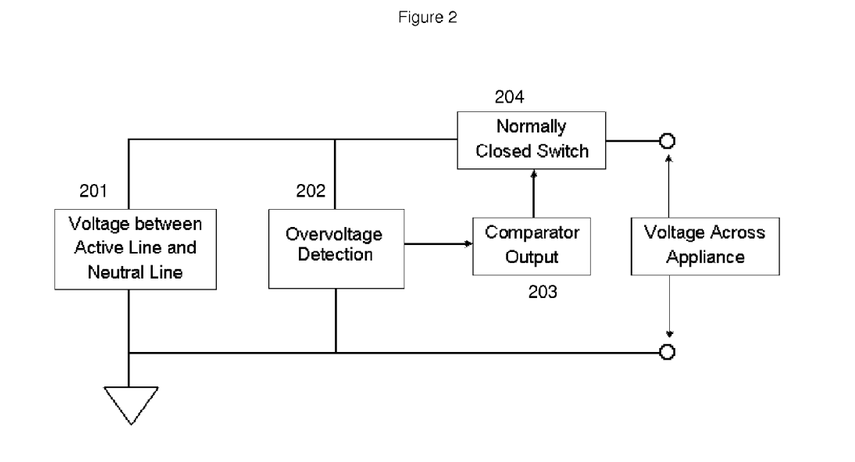
FIG. 2 is a block diagram showing the general, overall design of the system.

FIG. 2 is a block diagram of an overall system, incorporating the overvoltage protection system outlined in FIG. 1 with a switch 204 designed to break the circuit at the active line and prevent damage to any appliances connected to the line. This switch can be any sort of electrically controlled switch such as a relay, circuit breaker or transmission gate. The switch is normally closed so that the active line is connected with the appropriate high voltage input for the appliance. As long as the peak voltage 201 of the active line is within a specified range of the typical maximum value ($120\sqrt{2}$ volts in the US), then the output 203 of the voltage comparison 202 device will indicate the voltage conditions are normal. If the magnitude of the voltage on the line exceeds the maximum safe value, then the output of the voltage comparison device will indicate this condition and trigger the switch to open so that the active line voltage is no longer connected to the high voltage line input of the appliance and no excessive current can flow into the appliance. The switch may remain open until the voltage falls back down to a suitable level. The switch could also be a breaker circuit such that the switch would remain open if the active line input voltage is too high and have to be manually reset once the user believes the overvoltage condition is safe. This would be useful for preventing on-off switching of current to appliances with motors or compressors or other devices requiring high starting current, so that they do not continuously draw high current while the power is fluctuating due to a broken line or other failure in the local power grid.

Figure 3:
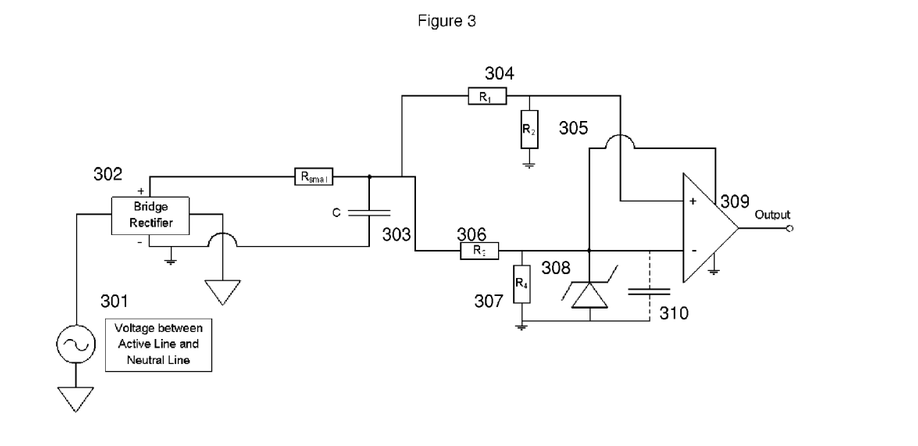
FIG. 3 is one embodiment of the voltage detection part of the invention using standard circuit components.

FIG. 3 is a diagram illustrating one embodiment of the invention. In this embodiment, the active line voltage 301 is fed into a voltage rectifier 302, which has a positive output voltage equal to the magnitude of the maximum line voltage minus any forward biased voltage drops across the diodes of the bridge rectifier, typically 0.5-1.0 volts. The capacitor C (303) charges up to this peak value and as long as the resistors R1 (304), R2 (305), R3 (306) and R4 (307) are sufficiently large as to ensure a large time constant, its voltage will decrease marginally and remain at approximately this peak value with minimal ripple voltage. The resistors R3 and R4 are chosen such that the voltage will be sufficient to bias the Zener diode 308 into breakdown, maintaining a constant, predetermined DC voltage as long as the input voltage is within a predetermined range of a predetermined input value (typically $120\sqrt{2}$ volts in the US). Based on this DC value, resistors R1 and R2 are chosen such that at a predetermined maximum safe voltage value at the rectifier output, the voltage across R2 is equivalent to that of the DC voltage, and if the voltage is exceeded, then the voltage across R2 becomes greater than the voltage across the Zener diode. This has the effect of causing the output of the comparator 309 to go high if the maximum safe voltage level is exceeded, but if it is less than this value and close enough to the optimal voltage value such that no damage can be done to a given appliance, then the output of the comparator is low. The DC output of the Zener diode, since it can be held constant over a wide range of input voltage, can act as the positive rail for the comparator so that no external voltage sources or batteries have to be inserted into the overvoltage protection device. As long as the resistors R3 and R4 are properly chosen such that the voltage across R4 is enough to operate the Zener diode in breakdown mode while the input voltage is less than the optimal maximum input voltage magnitude, then the Zener diode can produce a consistent DC output for a wide range of values for the input line voltage. Since Zener diodes are often manufactured with a small percent deviation from the specified voltage, either resistor R1 or R2 can be a variable resistor so that fine tuning can be performed during manufacture. This will ensure that if the desired maximum value for the high voltage line is reached, it will produce a voltage across R2 such that it is approximately equal to the DC value of the Zener diode. Any further increase in the magnitude of the input voltage will cause the value of the voltage across R2 to rise above the DC value, making the output of the comparator equivalent to the high voltage input rail.

Figure 4:
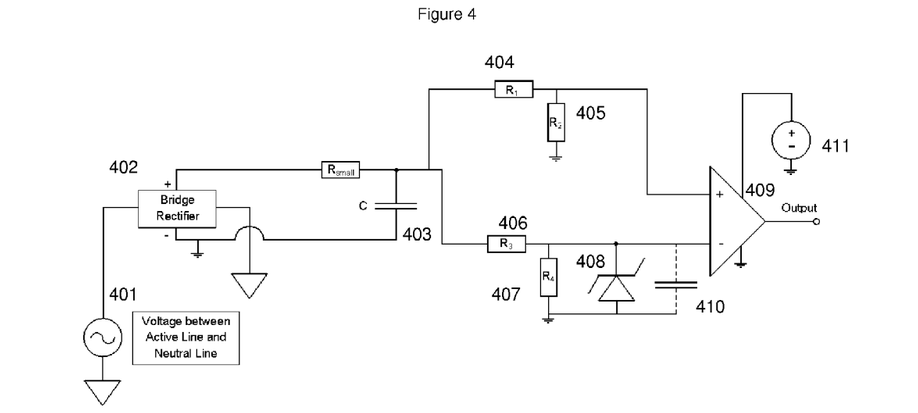
FIG. 4 is another embodiment of the voltage detection part of the invention using standard circuit components.

In this configuration, the high voltage rail will only be capable of supplying the current equivalent to that flowing through the Zener diode. This may be perfectly acceptable depending on the signal output from the comparator. If the comparator is simply to output a voltage to a switch, the current does not need to be high. If the comparator is to output a current through a relay or circuit breaker, isolating the high voltage input line in the event of an excessive input voltage on the active line, then more current may be required. This can be accomplished by placing a capacitor 310 in parallel with the Zener diode to store charge and output the additional current through the rail of the comparator when the voltage across R2 exceeds the Zener voltage. If additional, continuous current output from the comparator is needed and cannot be supplied due to the resistance from R3 and R4, a separate battery 411 can be used to supply the high voltage rail for the comparator. This may be useful for certain applications, but eliminates the internalization of the system given by using the output voltage across the Zener diode for the comparator's high voltage rail. This embodiment is shown in FIG. 4.

Figure 5:
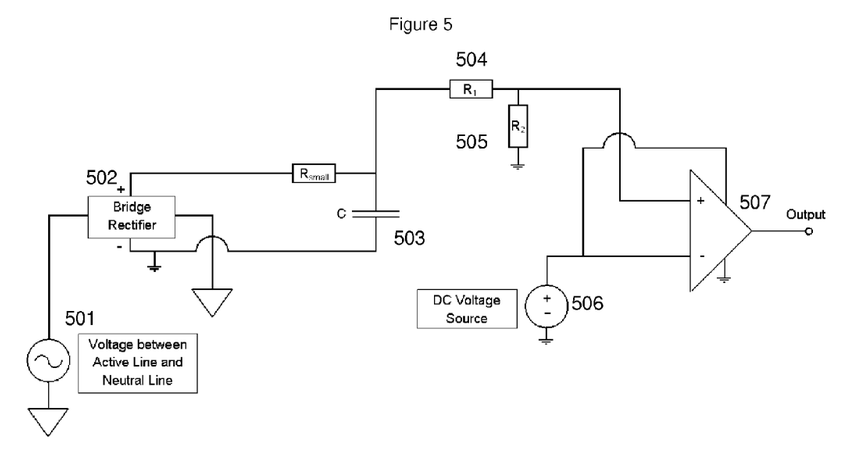
FIG. 5 is an alternate embodiment of the voltage detection part of the invention using standard circuit components.

FIG. 5 is a diagram illustrating an alternate embodiment of the invention. In this case, the initial rectifying of the voltage is performed the same way as it was in FIGS. 3 and 4. However, instead of biasing a Zener diode to produce a DC output, a direct DC battery 506 is used as the reference. This has the advantage of being easier to produce. In the design of FIGS. 3 and 4, the resistors R3 and R4 act to limit the current for the comparator's high voltage rail and output, so any electronics beyond the output of the comparator must take this input impedance into account. However, having a battery connected directly to the positive voltage rail of the comparator will ensure that the comparator can output sufficient current. One major disadvantage of the design of FIG. 5 is that a battery typically has a shelf life and its voltage will decrease over time, eventually causing a possible false alarm when the voltage gets sufficiently low or failing to output enough current through the positive rail of the comparator. A battery indicator would be required to ensure that the device does not malfunction and arbitrarily send out false readings of overvoltage caused by broken service neutral lines.

Figure 6:
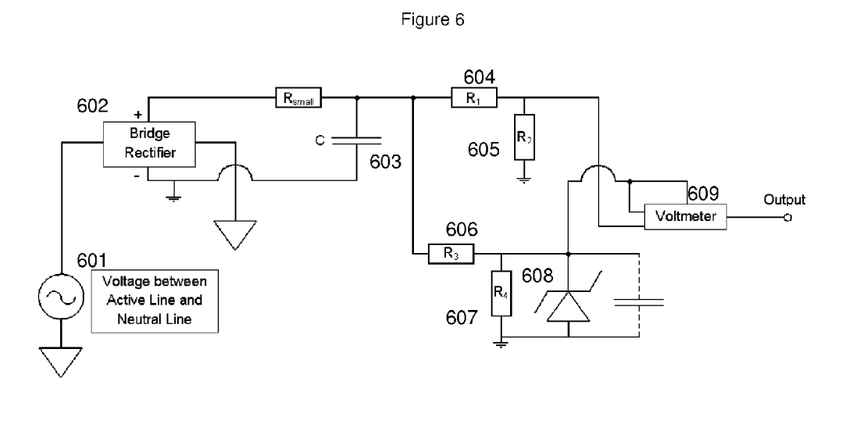
FIG. 6 is an alternate embodiment of the voltage detection part of the invention using standard circuit components and a voltmeter for detecting voltage.

FIG. 6 is a diagram illustrating another alternate embodiment of the invention. In this case, a complete voltmeter 609 is used to directly measure the voltage across a resistor network at the output of the rectifier. The voltmeter can measure the exact value and digital logic may be used to determine if the voltage output is too high and output the appropriate signal. In this embodiment, the rectifier 602 and Zener diode 608 act to form both a DC voltage source for comparison and a power supply for the voltmeter. The voltmeter can directly measure the voltage across the voltage divider network to determine if the voltage exceeds the maximum safe value. The input voltage that powers the voltmeter may also be measured for reference against the voltage divider network. This may be desirable in cases where extreme precision of the voltage measurement is desired, but comparison via the comparator typically works just as well for determining safe levels of voltage and is far more cost effective. The voltmeter may use a separate battery for its power supply and reference voltage, although using an active battery has the same drawbacks as the design in FIG. 5.

Figure 7:
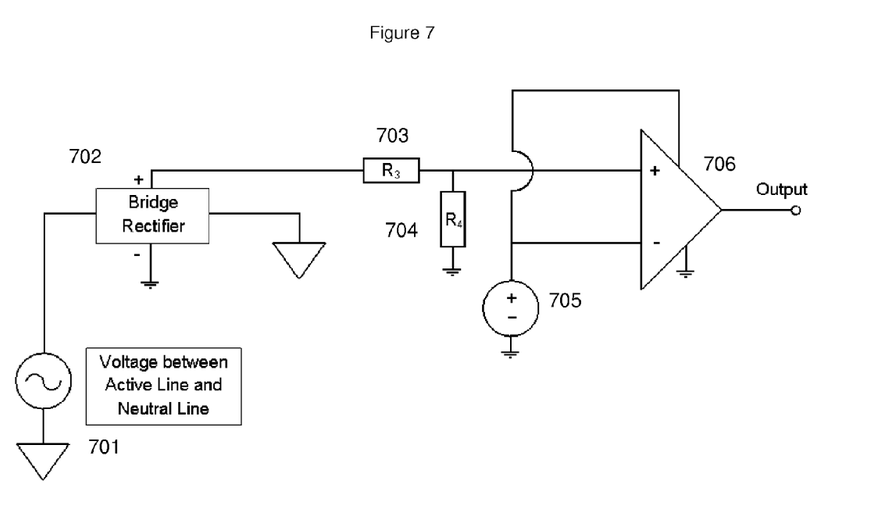
FIG. 7 is an embodiment of the invention where the rectifier circuit is eliminated and two different comparison devices are used, generating two different outputs.

FIG. 7 is a diagram of another embodiment of the invention. In this embodiment, the voltage is rectified with a rectifier 702 but the capacitor for holding the output voltage of the rectifier is removed. Only the magnitude of the voltage itself is fed through the voltage divider network. A DC battery source 705 is used to provide an input to a comparator and provide power for the positive rail of the comparator. The resistors of the voltage divider network are selected such that the voltage across one of the resistors is fed into one input of the comparator and is set such that the peak of the voltage across it (typically a sine wave voltage with a frequency of 50 Hz or 60 Hz in the United States) is always less than the DC voltage source if the active line voltage 701 is below a predetermined maximum safe value. If the service neutral line breaks or another failure causes an overvoltage condition, the peak value will rise above the level of the DC voltage source, causing the output of the comparator to be equal to the positive rail voltage, which is approximately equal to the DC voltage source value. Since there is no capacitor, this value will not be held at the approximate peak value, so even a single spike in the voltage will trigger a high output from the comparator. This output can be latched so that it remains high if it goes high at any point, but the latching mechanism will add complexity and cost. The output of the comparator could tie directly to a circuit breaker of the active line, which would interrupt the flow of current through the active line if the comparator's output ever goes high. This is more responsive to sharp spikes in voltage, but requires an active battery which has the same drawbacks as the designs of FIGS. 3 and 4. This design could also be implemented by using a voltmeter instead of a comparator and using the battery as the power source for the voltmeter.

Figure 8:
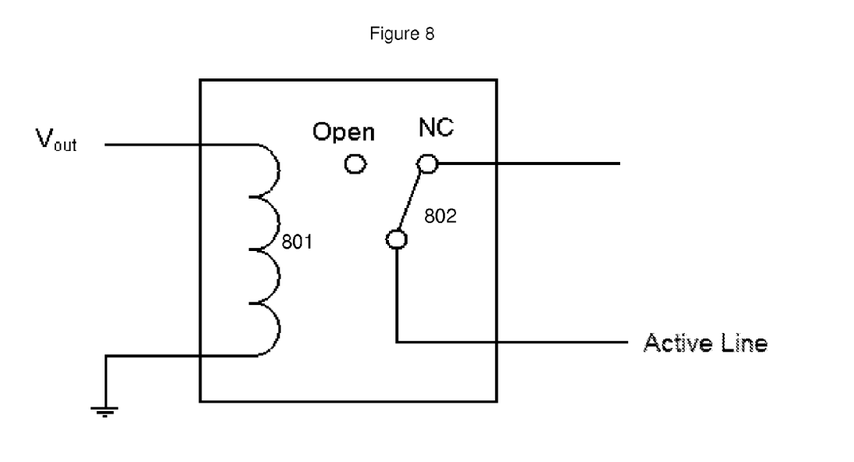
FIG. 8 is a diagram illustrating how the output of the circuit can be used to open a relay or circuit breaker to shut off voltage to the house, business or appliance connected to the circuit.

FIG. 8 is a diagram illustrating a possible method of preventing the active line voltage from reaching an appliance if it is too high in its magnitude and peak value. In this case, the output of the comparator is fed into an electromagnet coil 801. If the comparator output is low, there is almost zero current flowing through the coil but if there is an overvoltage condition and the output is high, causing current to flow through the coil, then the magnetic field can flip a switch 802, preventing this voltage from reaching the line voltage input terminal of the appliances. This switch can be either a relay, in which case it will flip back to the closed position once the line voltage is within normal range again, or it can be a circuit breaker in which case it will remain open until manually pressed back to the closed position. A relay would work well for passive appliances such as lights which are desired to have continuous operation if they're switched "on" and are not as ill-affected by discontinuous current, while a circuit breaker would work better for a device such as a motor to prevent it from constantly restarting and drawing excessive starting current, potentially damaging the motor in the process if the voltage begins varying rapidly. It would also be useful to break the flow of current to digital electronics rather than have intermittent on/off switching as the active line voltage varies.

Figure 9:
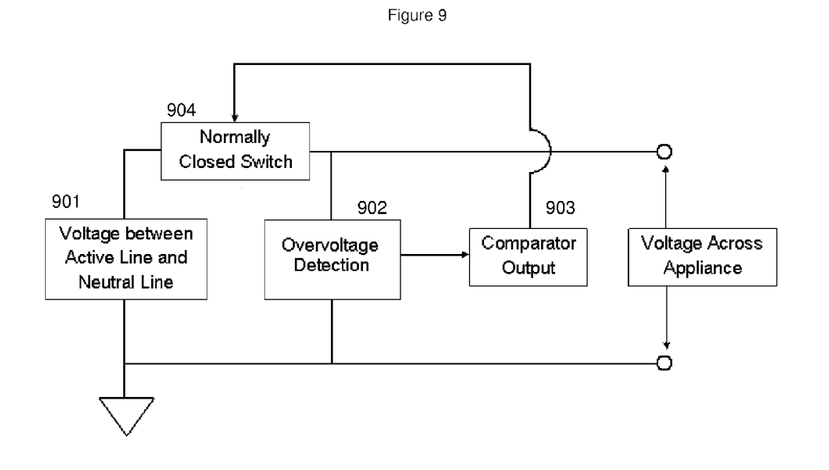
FIG. 9 is a block diagram showing an alternate embodiment similar to FIG. 2, but with a feedback loop to prevent damage to the overvoltage detection circuit itself if the input voltage is too high.

FIG. 9 is a block diagram of an alternate layout for the system. In this system, it is similar to that of FIG. 2 except that the output 903 of the comparator leads to a cutoff switch 904 placed in series with the active line prior to the input of the rectifier circuit of the overvoltage detection device. This is useful if the device is a permanent switch such as a circuit breaker, since closing a spring relay would simply remove the voltage from the circuit, causing the input to go low and the relay to open back up, providing only intermittent protection. If the device is a circuit breaker, then once the maximum safe voltage is exceeded and the output of the comparator is high, then immediately afterwards, the high voltage signal will cause a circuit breaker to trip, preventing any damage from occurring to electronics or appliances further down the line and simultaneously preventing any damage to the overvoltage circuit described in this application. This way, the tolerances of the components used to make this device can be controlled such that an overvoltage to the line will cut off current to both this device and any subsequent devices, saving the electronics of this device and allowing it to continue to fulfill its function of preventing excessive line voltages from damaging equipment. For example, if the maximum safe peak value of the active line is 185 volts (the typical peak with 120 VRMS is around 170 volts), then the resistors, capacitor and rectifier components need only tolerate voltage and current values with respect to this input value. It will be guaranteed that if this value is exceeded, a switch will be opened via feedback from the output of the comparator and will prevent any further current from being input into the circuit, in case the voltage is starting to rise erratically due to a broken neutral line or another overvoltage failure.

Figure 10:
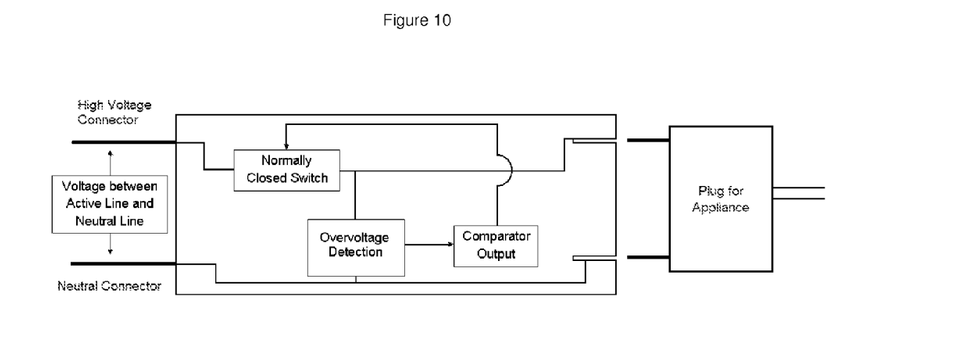
FIG. 10 is a drawing showing the block diagram of FIG. 9 and how it can fit into a module designed to protect items plugged into a wall outlet from damage due to overvoltage caused by a broken service neutral wire.

FIG. 10 is a view showing how the overall system can be implemented into a small pluggable device. The device can act as a module that plugs into the wall outlet and has standard electrical outlet input that accept electronic appliances' plugs as inputs, providing them overvoltage protection. This way, if the user is using a valuable piece of electronic equipment, that equipment can be protected anywhere with a compatible electrical outlet without fear of having a broken service neutral line damage the equipment. Alternatively, this could be integrated into the plug of an appliance or into the internal electronics of appliances rather than as a separate module.

The invention described in this disclosure utilizes the standard voltage in the United States as a reference, but can be adjusted to suit other voltages in other countries as well. Those skilled in the art may recognize that changes may be made without departing from the scope of this invention. All general modifications should be considered equivalents, falling within the scope of this invention.

What is claimed is:

1. A device that detects an overvoltage condition caused by a broken service neutral line or another overvoltage anomaly comprising:
    a rectifier circuit placed between the neutral connection and active line connection of a power line such that the output is a positive voltage with a peak value approximately equal to the maximum magnitude of the input voltage,
    a capacitor to hold the voltage output of the rectifier circuit at approximately a constant value near the peak voltage,
    a DC voltage source of a predetermined-value,
    a voltage divider network such that the voltage across a given resistive section of the network is equal to or greater than a predetermined value when the voltage output of the rectifier circuit is equal to or greater than a predetermined maximum safe value,
    a device for comparing the DC voltage source value to the voltage across the given section of the voltage divider network,
    an output from the comparing device that will be a unique signal depending on whether the voltage across the given section of the voltage divider network is greater than or less than the predetermined DC voltage source used as a reference,
    wherein the device for comparing the DC voltage to the voltage across the given section of the voltage divider network is a comparator that outputs a high voltage signal supplied by its high voltage rail when the voltage across the given section of the voltage divider network is higher than the DC voltage and outputs a low voltage signal when the DC voltage is higher than the voltage across the given section of the voltage divider network, and
    wherein the DC voltage simultaneously provides the high voltage rail for the comparator.

2. The device of claim 1 wherein the DC voltage source is a Zener diode, biased by the output voltage of the rectifier such that its output is a constant DC value over a wide range of input voltages from the output of the rectifier.

3. The device of claim 1 wherein the DC voltage source is a battery, independent of the voltage on the active line.

4. The device of claim 1 wherein the output signal is input into a relay, causing it to open and prevent current from flowing further through the active line to other devices as long as the voltage across the given section of the voltage divider network is higher than the DC voltage so that the comparator's output signal is high.

5. The device of claim 1 wherein the output signal is input into a circuit breaker, causing it to permanently break the circuit at the active line prior to the input to the overvoltage detection circuit and prevent current from flowing further through the active line to other devices connected to the active line when the voltage across the given section of the voltage network goes higher than the DC voltage.

6. The device of claim 1 wherein the voltage divider network contains a variable resistor such that the voltage across the given section can be finely adjusted for the system such that it will only exceed the DC voltage when the active line input voltage is above a predetermined safe value.

7. The device of claim 1 wherein the rectifier circuit utilizes a diode bridge and capacitor such that the voltage is held approximately constant across the capacitor and the subsequent resistors in the circuit are chosen such that the time constant of the capacitor and the resistors is large compared to the nominal period of the voltage and the voltage decay and ripple are minimal.

8. The device of claim 1 wherein the output from the comparing device is fed back to a circuit breaker along the active line prior to its input to the rectifier circuit, so that when an overvoltage condition occurs and the output from the comparing device indicates this and trips the circuit breaker, it will prevent any current from traveling into the input rectifier or any other devices connected to the active line.

9. The device of claim 2 wherein a separate battery provides a voltage source for the voltage comparing device.

10. A device comprising:
    an input voltage between a neutral line and active line,
    a DC voltage source of a predetermined value,
    a voltage divider network such that the voltage across a given resistive section of the network is equal to or greater in magnitude than a predetermined value when the peak active line voltage is equal to or greater than a predetermined maximum safe value,
    a device for comparing the DC voltage source value to the voltage across the given section of the voltage divider network and utilizing the DC voltage source to power the comparing device,
    an output from the comparing device that will be unique depending on whether the instantaneous value of the voltage across the given resistive section of the voltage divider network is greater than or less than the DC voltage source reference value,
    wherein the device for comparing the DC voltage to the voltage across the given section of the voltage divider network is a comparator that outputs a low voltage signal when the voltage across the given section of the voltage divider network is higher than the DC voltage and outputs a high voltage signal supplied by its high voltage rails when the DC voltage is higher than the voltage across the given section of the voltage divider network, and wherein the DC voltage simultaneously provides the high voltage rail for the comparator.

11. The device of claim 10 wherein the output signal is input into a relay, causing it to open and prevent current from flowing further through the active line to other devices as long as the voltage across the given section of the voltage network is higher than the DC voltage.

12. The device of claim 10 wherein the output signal is input into a circuit breaker, causing it to permanently break the circuit at the active line prior to the input to the overvoltage detection circuit and prevent current from flowing further through the active line to other devices connected to the active line when the voltage across the given section of the voltage network goes higher than the DC voltage.

13. The device of claim 10 wherein the output from the comparing device is fed back to a circuit breaker along the active line prior to its input to the rectifier circuit, so that when an overvoltage condition occurs and the output from the comparing device indicates this and trips the circuit breaker, it will prevent any current from traveling into the input rectifier or any other devices connected to the active line.

* * * * *